United States Patent
Rearick et al.

(10) Patent No.: US 12,108,559 B2
(45) Date of Patent: Oct. 1, 2024

(54) MODULAR EDGE POWER SYSTEMS

(71) Applicant: AcLeap Power Inc., Taipei City (TW)

(72) Inventors: Donald Rearick, Rowlett, TX (US); Roy Davis, Rowlett, TX (US); Jeremy Miles, McKinney, TX (US)

(73) Assignee: AcLeap Power Inc., Taipei (TW)

( * ) Notice: Subject to any disclaimer, the term of this patent is extended or adjusted under 35 U.S.C. 154(b) by 436 days.

(21) Appl. No.: 16/553,585

(22) Filed: Aug. 28, 2019

(65) Prior Publication Data

US 2020/0205309 A1  Jun. 25, 2020

Related U.S. Application Data

(60) Provisional application No. 62/784,352, filed on Dec. 21, 2018.

(51) Int. Cl.
*H05K 7/14* (2006.01)
*G06F 1/26* (2006.01)

(52) U.S. Cl.
CPC .......... *H05K 7/1492* (2013.01); *G06F 1/266* (2013.01); *H05K 7/1489* (2013.01)

(58) Field of Classification Search
CPC ..... H05K 7/1492; H05K 7/1489; G06F 1/266
USPC ......................................................... 307/43
See application file for complete search history.

(56) References Cited

U.S. PATENT DOCUMENTS

| | | | |
|---|---|---|---|
| 9,128,682 B2 | 9/2015 | Dean et al. | |
| 9,374,926 B1 | 6/2016 | Fontana | |
| 9,723,742 B2 | 8/2017 | Steeves | |
| 2003/0222848 A1 | 12/2003 | Solomon | |
| 2004/0231875 A1 | 11/2004 | Rasmussen et al. | |
| 2011/0304211 A1* | 12/2011 | Peterson | G06F 1/30 307/65 |
| 2013/0198534 A1 | 8/2013 | Bailey et al. | |
| 2013/0289789 A1 | 10/2013 | Ewing et al. | |
| 2014/0168884 A1 | 6/2014 | Wylie | |
| 2015/0143140 A1* | 5/2015 | Bailey | H02B 1/21 713/300 |
| 2015/0177797 A1 | 6/2015 | Butzer et al. | |
| 2016/0079722 A1 | 3/2016 | Ewing et al. | |
| 2017/0257970 A1* | 9/2017 | Alleman | G06F 1/20 |
| 2017/0364275 A1 | 12/2017 | Natarajan | |
| 2018/0082224 A1* | 3/2018 | Leslie | G06F 9/50 |

OTHER PUBLICATIONS

Partial supplementary European search report for PCT/US2019066664, dated Jul. 21, 2022, 14 pgs.
Written Opinion for related PCT/US2019/066664 dated Apr. 3, 2020, 5 pages.
International Search Report for related PCT/US2019/066664 dated Apr. 3, 2020, 2 pages.
Chinese Office Action for Chinese Patent Application No. 201980085074.0, dated Nov. 10, 2023, 12 pps.

* cited by examiner

*Primary Examiner* — Rexford N Barnie
*Assistant Examiner* — Swarna N Chowdhuri
(74) *Attorney, Agent, or Firm* — McCarter & English, LLP

(57) ABSTRACT

A modular edge power system is provided. The modular edge power system includes a housing and multiple edge modules. Each edge module is adapted to be removably inserted into the housing and provide, through a corresponding bus and with one or more power equipment submodules, power to one or more compute devices in a rack. Each bus is adapted to provide sufficient power to enable operation of every compute device in the rack.

20 Claims, 13 Drawing Sheets

MODULAR EDGE POWER SYSTEMS

CROSS-REFERENCE TO RELATED APPLICATION

The present application claims the benefit of U.S. Provisional Patent Application No. 62/784,352, filed Dec. 21, 2018, the entirety of which is incorporated herein by reference.

BACKGROUND

In typical data centers, such as those utilized in a cloud or edge architecture, compute devices (e.g., executing functions in virtualized environments, such as in virtual machines or containers, on behalf of client devices) are arranged in racks and power is delivered to each compute device in each rack by corresponding power electronics. Those power electronics may be integrated into each rack or located in one or more bays of the rack. If all or a portion of the power electronics in a rack fails or otherwise needs maintenance, the power to all of the compute devices in the rack may be interrupted, thereby reducing the ability of the data center to execute operations on behalf of client devices (e.g., pursuant to a service level agreement, in which the client agrees to pay a defined amount of money for a defined quality of service (QoS)). As such, the operator of the data center may forego a significant amount of money when performing maintenance operations on the power electronics in a rack.

SUMMARY OF THE INVENTION

In one aspect, the present disclosure provides a modular edge power system. The modular edge power system includes a housing and multiple edge modules. Each edge module is adapted to be removably inserted into the housing and provide, through a corresponding bus and with one or more power equipment submodules, power to one or more compute devices in a rack. Each bus provides sufficient power to enable operation of every compute device in the rack.

In another aspect, the present disclosure provides a method of operating a modular edge power system. The method includes monitoring, by a modular edge power system, an operational status of each of multiple edge modules in the modular edge power system. Each edge module includes multiple power equipment submodules. The method also includes determining, by the modular edge power system and as a function of the operational status, whether maintenance should be performed on one of the edge modules. Additionally, the method includes providing, by the modular edge power system, and in response to a determination that maintenance should be performed on one of the edge modules, report data to another device, indicating that maintenance should be performed on one of the edge modules.

In yet another aspect, the present disclosure provides one or more machine-readable storage media having a plurality of instructions stored thereon that, in response to being executed, cause a modular edge power system to monitor an operational status of each of multiple edge modules in the modular edge power system. Each edge module includes multiple power equipment submodules. The instructions also cause the modular edge power system to determine, as a function of the operational status, whether maintenance should be performed on one of the edge modules. Further, the instructions cause the modular edge power system to provide, in response to a determination that maintenance should be performed on one of the edge modules, report data to another device, indicating that maintenance should be performed on one of the edge modules.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements. The detailed description particularly refers to the accompanying figures in which.

DETAILED DESCRIPTION OF THE DRAWINGS

Figure 1:
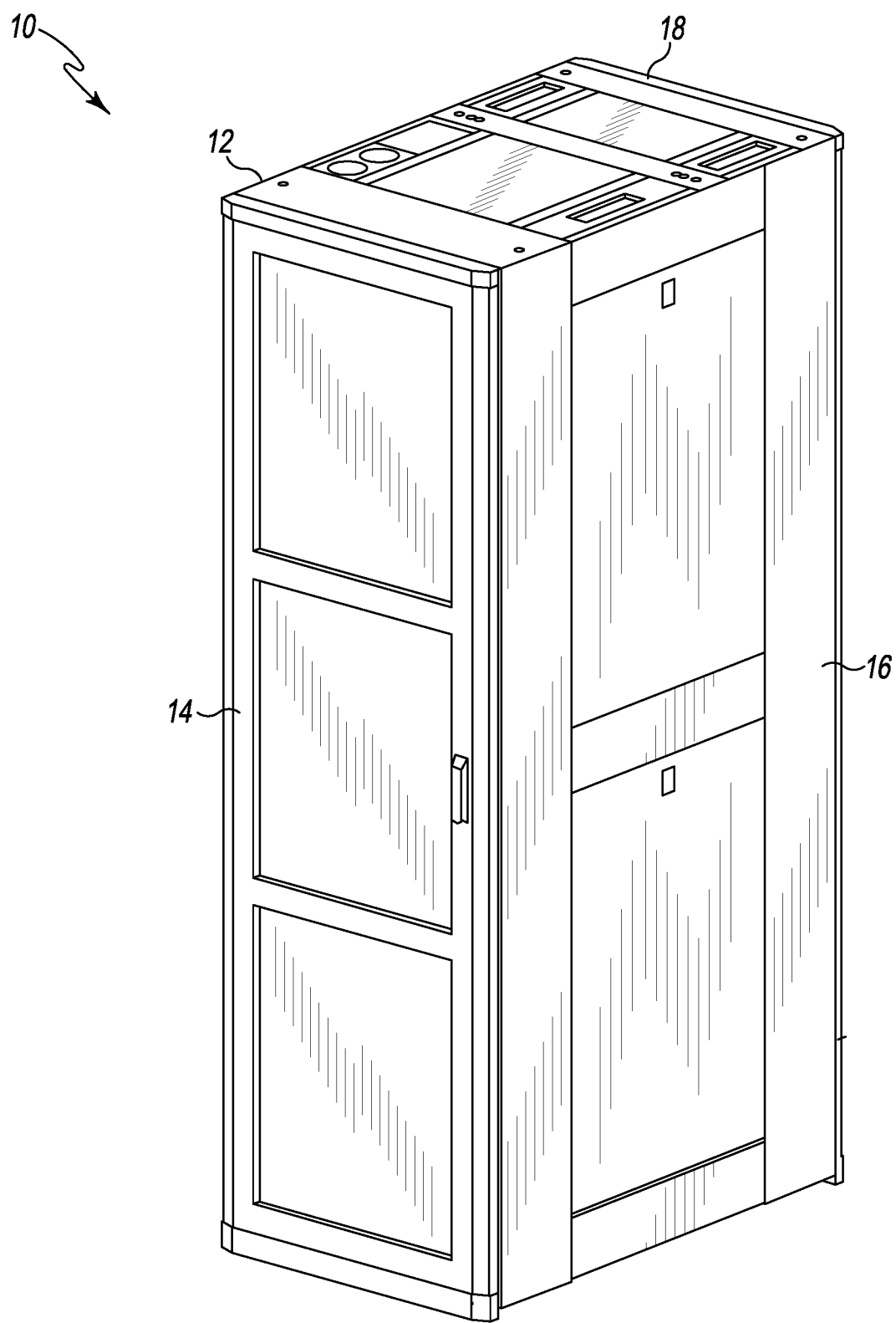
FIG. 1 shows a perspective view of the exterior of one illustrative embodiment of an integrated power cabinet with optional doors and side panels intact for use in a data center.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The presently disclosed modular edge power systems house power equipment in an edge volume outside of the rack that houses revenue generating equipment (e.g., compute devices), thereby maximizing cabinet space for revenue generating equipment. The modular edge power systems also provide other benefits. For example, the edge power systems of the present disclosure utilize a modular design in which the components of the power equipment having higher failure rates are mounted in easily removable and replaceable edge modules, allowing for quick and cost-effective field replacement. Additionally, the edge modules themselves are configurable to hold varying numbers of rectifier submodules and battery submodules, depending on the needs of the cabinet (which may be unknown until deployment and/or change over time). This modularity also provides the ability to configure the system with a minimal set of parts.

In addition, the edge power systems of the present disclosure utilize a redundant architecture in which the power system is divided into two (or more) busses or channels (e.g., A and B busses) providing redundant power supply to the revenue generating equipment of the cabinet. This redundancy allows one edge module to be removed (for replacement, repair, modification, etc.) while the other edge module (s) continue to function and supply power to the revenue generating equipment. For example, if one edge module experiences a failure and needs to be replaced, this replacement can be performed without disturbing or turning off other edge module(s) in the edge power system. The redundancy and modularity of the presently disclosed systems allow for improved maintenance of the cabinets with reduced downtime.

Further, the edge power systems of the present disclosure include a simple network management protocol (SNMP) agent (also referred to herein as a monitor logic unit) that identifies and monitors the various modules plugged into the edge power system. For instance, the SNMP agent can monitor the operational states of the edge modules and of any submodules (e.g., rectifier submodules and battery submodules) mounted to the edge modules. The SNMP agent can provide information regarding the configuration and status of the components of the edge power system to a building management system of the facility housing the cabinet, allowing for remote monitoring and assessment of the operation of the edge power system. For example, the building management system may provide a web application by which an owner or manager of the cabinet and associated equipment can remotely monitor and assess the operational status of the equipment. Thus, the SNMP agent, in conjunction with the building management system, can alert the owner or manager when one of the edge modules may need to be removed and replaced.

Referring now to FIG. 1, the exterior of one illustrative embodiment of a modular edge power system 10 for use in a data center is shown. The modular edge power system 10 includes a cabinet (e.g., a housing) 12. A front side 14, a right side 16, and a top side 18 of the cabinet 12 can be seen in FIG. 1. In the illustrative embodiment, the front side 14 of the cabinet 12 includes door that may be selectively opened or left off to expose the interior of the cabinet and electrical components mounted therein.

Figure 2:
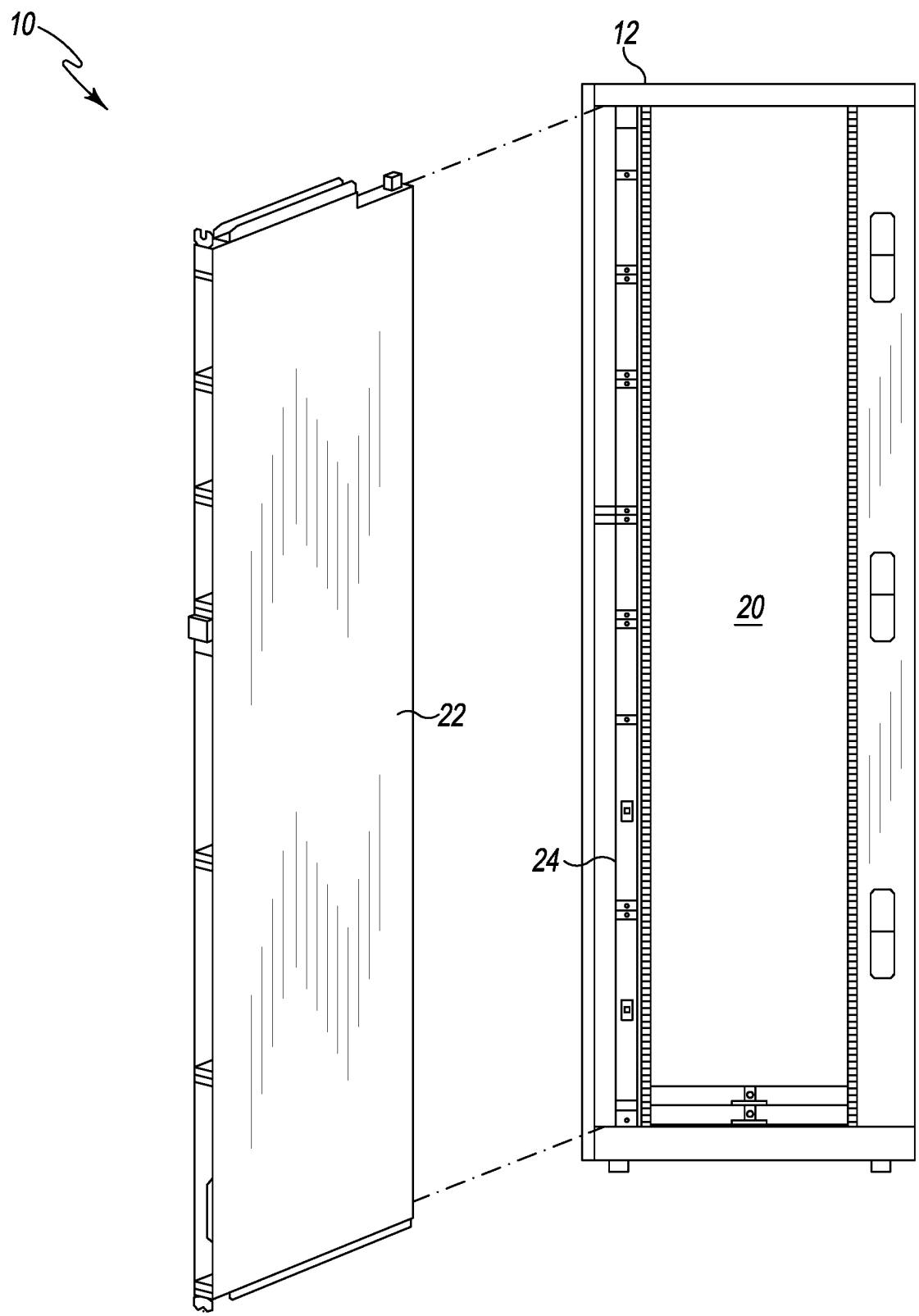
FIG. 2 shows a front plan view of one illustrative embodiment of the interior of the cabinet of FIG. 1.

Referring now to FIG. 2, a front plan view of the interior of the cabinet 12 is shown. A central compartment 20 in the interior of the cabinet 12 is configured to support and house revenue generating equipment (e.g., compute devices). As shown, the modular edge power system 10 illustratively includes two edge modules 22, 24, positioned next to one another along the left side of the cabinet 12, with each edge module 22, 24 spanning most of the interior height of the cabinet from near the top of the cabinet 12 to near the bottom of the cabinet 12. While the modular edge power system 10 is illustrated in the drawings as including two edge modules 22, 24, it is contemplated that other embodiments may include more edge modules (e.g., 3, 4, 5, etc.) or less edge modules (e.g., a single one). Additionally, while the edge modules 22, 24 are illustrated in the drawings as being positioned along the left side of the cabinet, it is contemplated that the edge modules 22, 24 may be positioned in other locations within the cabinet. By way of example, in another illustrative embodiment, the edge modules 22, 24 of the modular edge power system 10 may both be positioned along the right side of the cabinet 12. In still another illustrative embodiment, one (or more) edge modules 22, 24 could be positioned along the left side of the cabinet 12 while another one (or more) of the edge modules 22, 24 could be positioned along the right side of the cabinet 12.

Figure 3A:
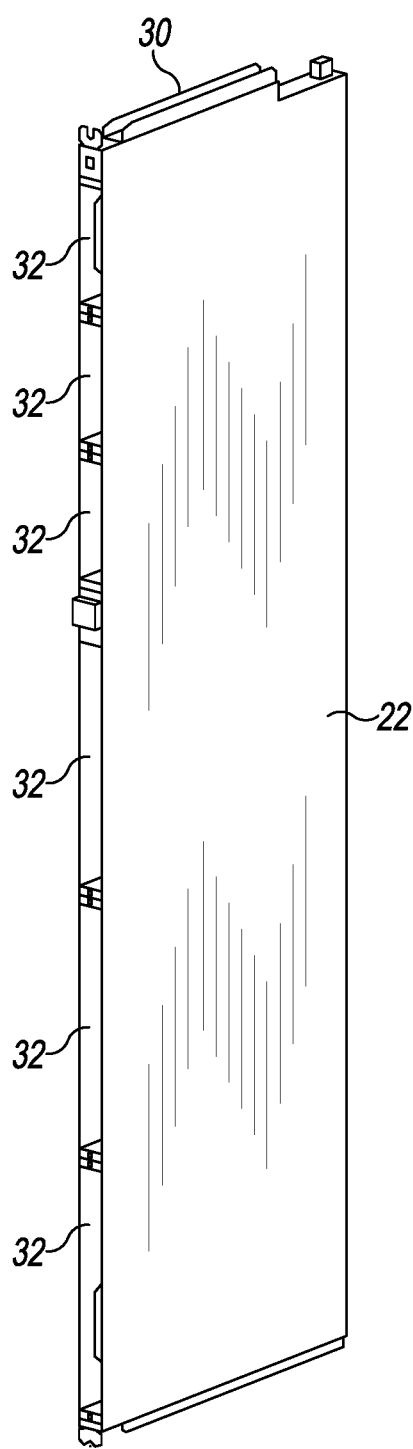
FIG. 3A shows a front perspective view of one illustrative embodiment of an edge module that may be used in the cabinet of FIG. 1.
Figure 3B:
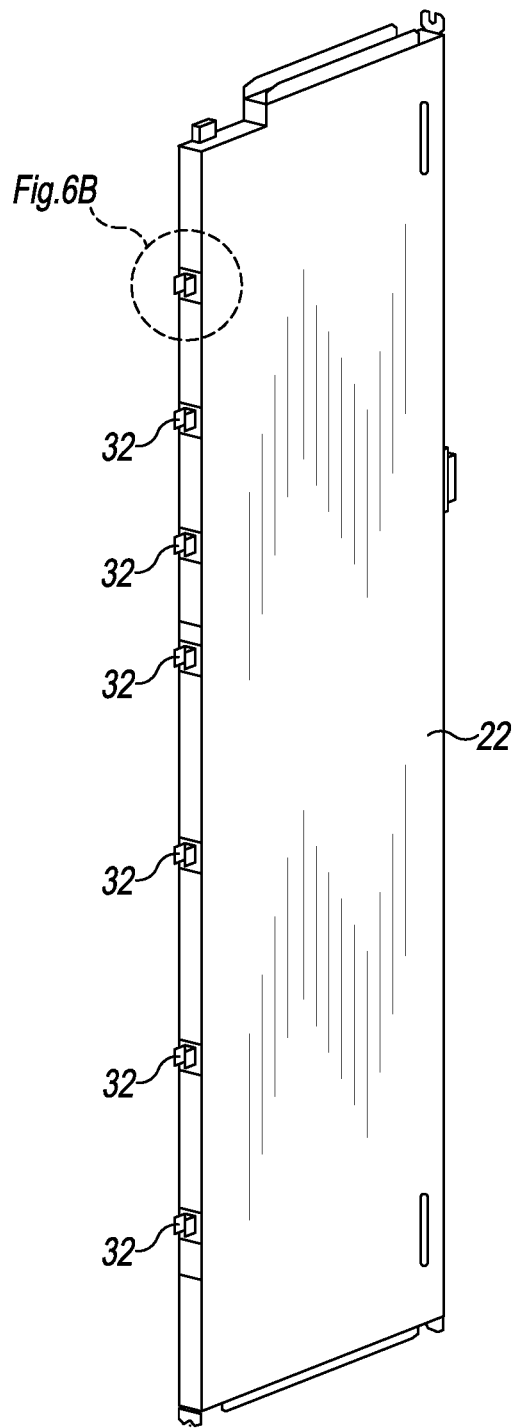
FIG. 3B shows a rear perspective view of the edge module of FIG. 3A.

Referring now to FIGS. 3A-B, front and rear perspective views of one illustrative embodiment of the edge module 22 are shown. The edge module 22 includes upper guide rails 30 positioned along a top side of the edge module 22 to assist in mounting the edge module 22 in the cabinet 12. The edge module 22 similarly includes lower guide rails (not shown) positioned along a bottom side of the edge module 22 to assist in mounting the edge module 22 in the cabinet 12. As shown in FIG. 3A, the front side of the edge module 22 includes a plurality of bays 32 for receiving power equipment submodules (e.g., power electronics), such as rectifier submodules (e.g., each embodied as circuitry configured to convert an alternating current into a direct current) and battery submodules (e.g., each embodied as a battery configured to store energy and discharge the energy on an as needed basis, such as when power to the modular edge power system 10 is interrupted). As shown in FIG. 3B, the rear side of the edge module includes a plurality of connectors 34 for interfacing with a fixed bus assembly of the modular edge power system 10 (further discussed below).

Figure 4:
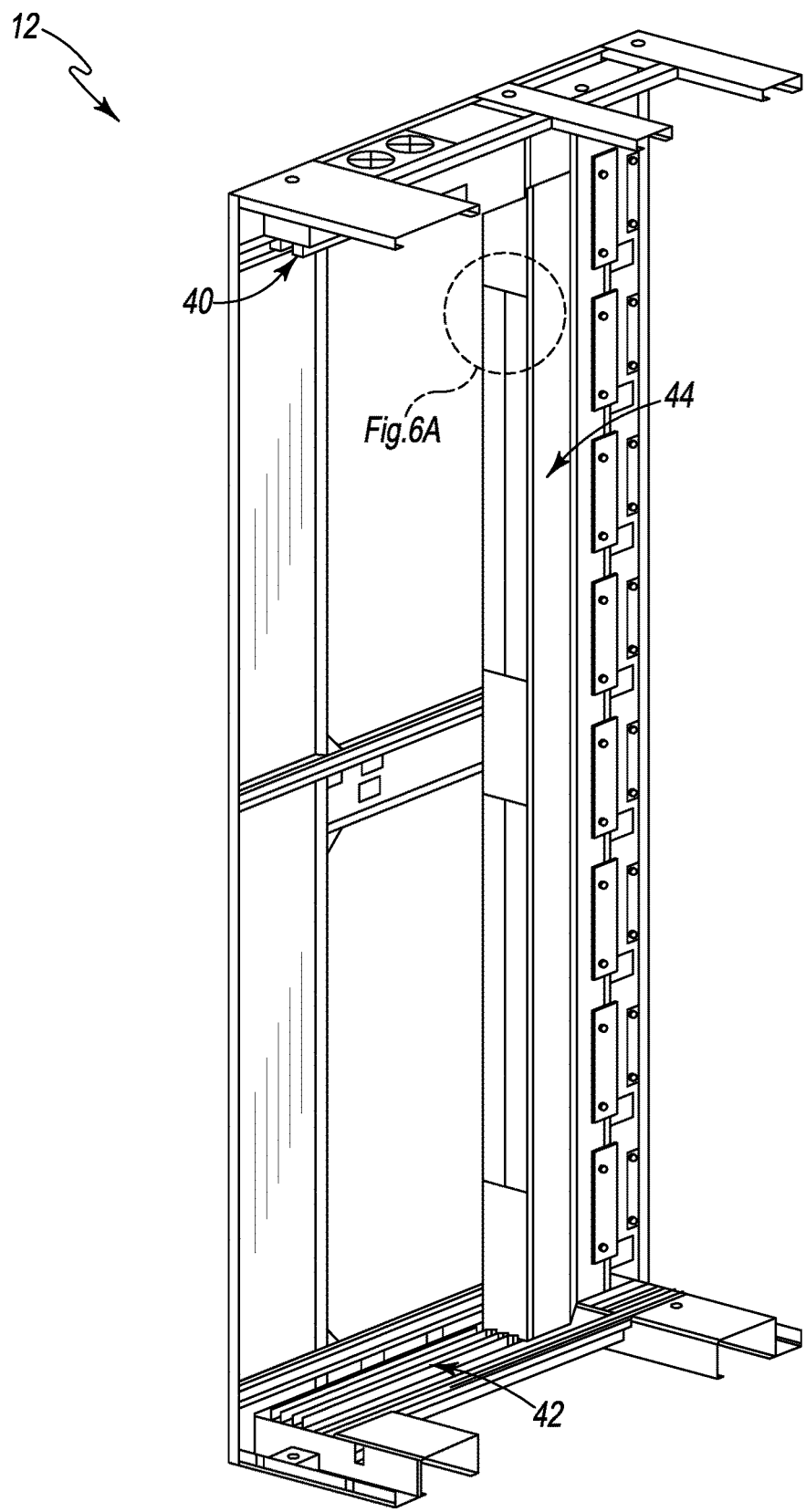
FIG. 4 shows a cross-sectional, perspective view of the interior of the cabinet of FIG. 1, without the edge modules installed.
Figure 5:
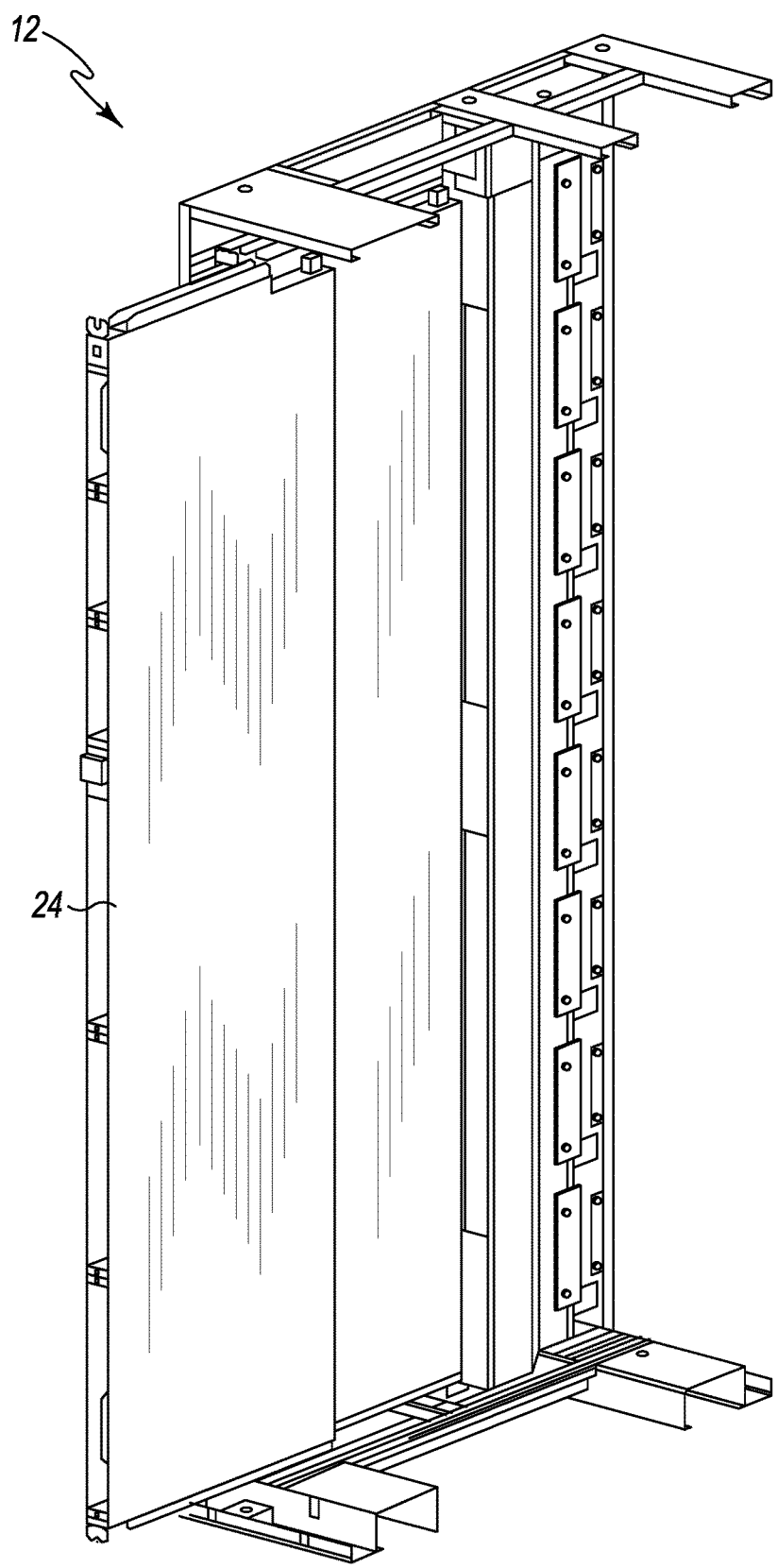
FIG. 5 shows a cross-sectional, perspective view of the interior of the cabinet of FIG. 1, with one edge module installed in the cabinet and another edge module in the process of being installed in (or removed from) the cabinet.

Referring now to FIG. 4, an interior of the cabinet 12 is shown in a cross-sectional, perspective view without any edge modules 22, 24 installed. The cabinet 12 includes upper guide rails 40 that are configured to interface with the upper guide rails 30 of each edge module 22, 24 to assist in mounting the corresponding edge module 22, 24 in the cabinet 12. Similarly, the cabinet 12 includes lower guide rails 42 that are configured to interface with the lower guide rails of each edge module 22, 24 to assist in mounting the corresponding edge module 22, 24 in the cabinet 12. As illustrated in FIG. 5, the edge modules 22, 24 can slide into and out of the cabinet 12 along the guide rails 40, 42. In the illustrative embodiment, the edge modules 22, 24 are designed to be installed/removed from a front side (e.g., the front side 14, shown in FIG. 1) of the cabinet 12. In addition to the edge modules 22, 24, the modular edge power system 10, in the illustrative embodiment, also includes a fixed edge assembly 44 that is positioned near the rear of the cabinet 12. In the illustrative embodiment, the fixed edge assembly 44 is designed to be non-removable during operation of the cabinet 12. As such, the fixed edge assembly 44 only contains components with low failure rates (e.g., copper, sheet metal, wire sets, insulators, etc.) such that a need to repair or replace any components of the fixed edge assembly 44 will be very rare. In the illustrative embodiment, no electronics or printed wire board (PWB) assemblies are included in the fixed edge assembly 44. Rather, such components are included in the easily replaceable edge modules 22, 24.

Figure 6A:
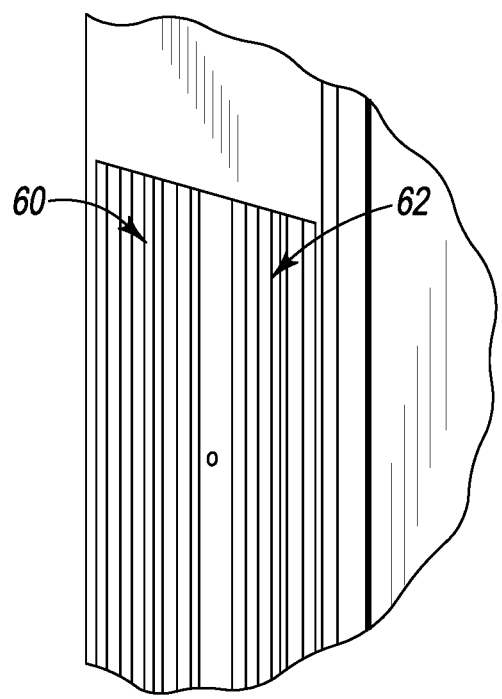
FIG. 6A shows a detailed perspective view of a portion of fixed bus assemblies that are visible in FIG. 4 (one of which is visible in FIG. 5)
Figure 6B:
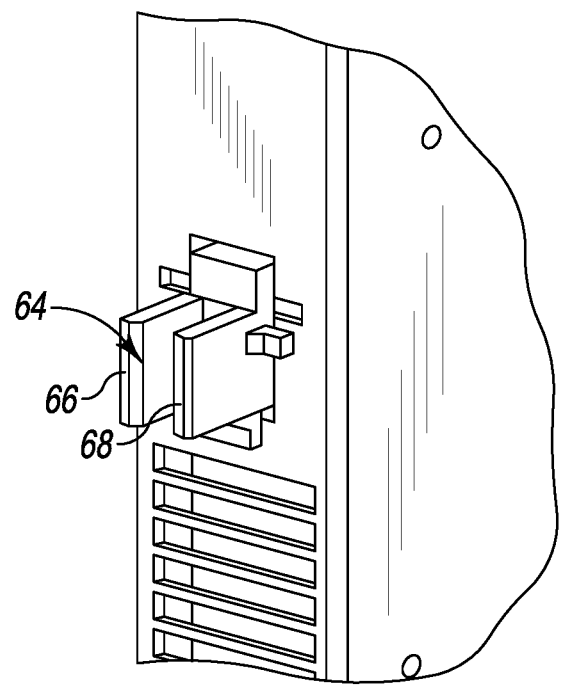
FIG. 6B shows a detailed perspective view of a connector of the edge module of FIG. 3B for interfacing with one of the fixed bus assemblies of FIG. 6A.

Referring now to FIG. 6A, a detailed perspective view of a portion of two fixed bus assemblies 60, 62 of the fixed edge assembly 44 is shown. The fixed bus assemblies 60, 62 each run vertically along a front side of the fixed edge assembly 44 that faces the edge modules 22, 24. The fixed bus assembly 60 is configured to interface with and supply power to a first edge module (e.g., the edge module 22), while the fixed bus assembly 62 is configured to interface with and supply power to a second edge module (e.g., the edge module 24) of the modular edge power system 10. In the illustrative embodiment, each of the fixed bus assemblies 60, 62 is embodied as an Open Compute Project (OCP)-style 48V bus (e.g., a 48V bus bar and a return bus bar, each of which may be silver plated and have tips that are offset from each other by a predefined distance, such as 1.5 mm). FIG. 6B shows a detailed perspective view of a connector 64 located along the rear side of one the edge modules 22, 24. The connector 64 is configured to interface with and electrically couple to one of the fixed bus assemblies 60, 62 (to receive power therefrom). As such, in the illustrative embodiment, the connector is an OCP style bus connector.

The connector 64, in the illustrative embodiment, is configured to be inserted into the fixed bus assembly 60 as one edge module (e.g., the edge module 22) is slid into the cabinet (see FIG. 5) such that conductors 66, 68 in the connector 64 electrically couple to conductors (e.g., the 48V bus bar and the return bus bar) in the fixed bus assembly 60.

Figure 7:
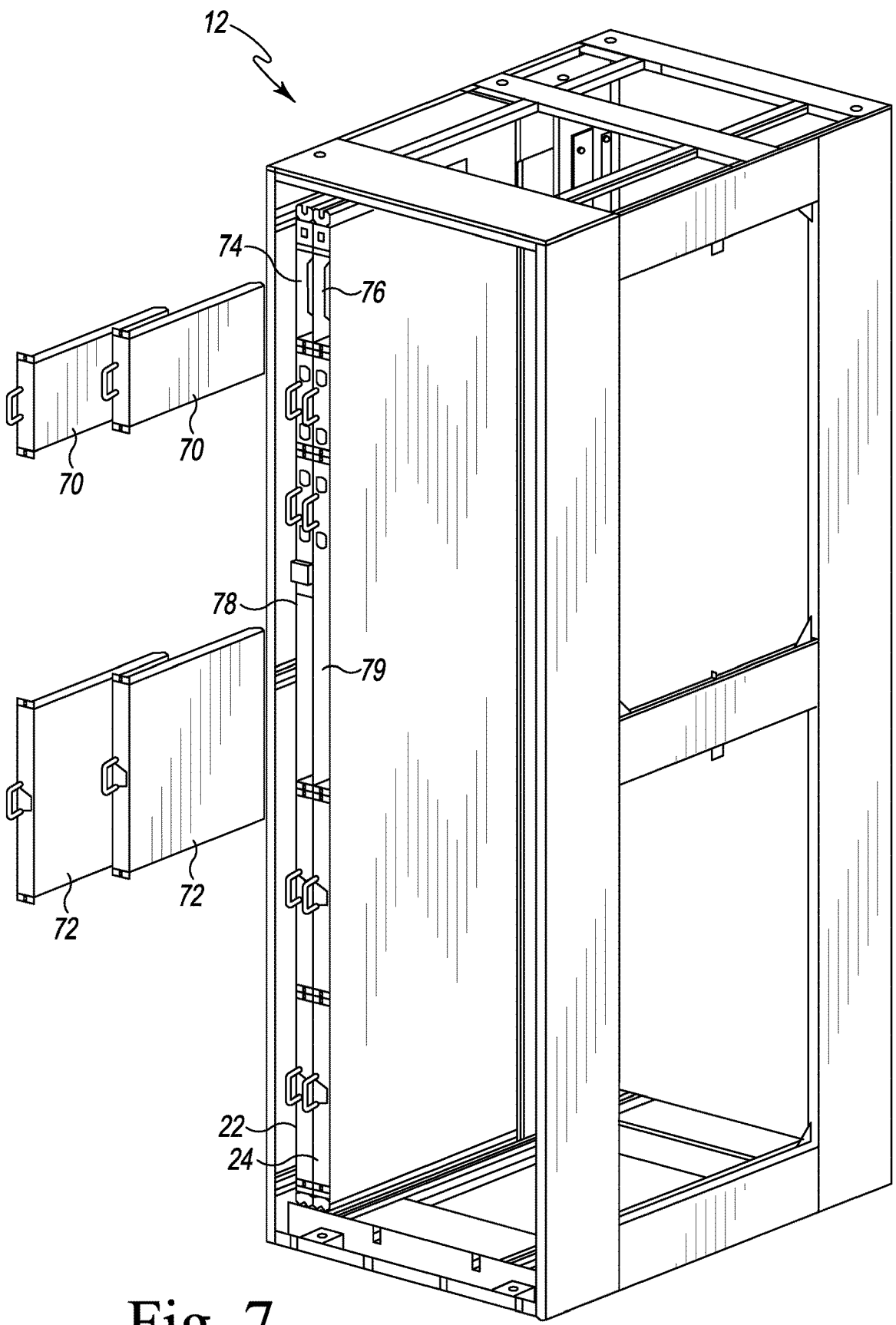
FIG. 7 shows a perspective view of the interior of the cabinet of FIG. 1, with two edge modules installed in the cabinet, illustrating how rectifier submodules and battery submodules may be installed in and removed from the edge modules.

Referring now to FIG. 7, the interior of the cabinet 12 is shown with the two edge modules 22, 24 installed. Two rectifier submodules 70 are shown removed from corresponding bays 74, 76 in the edge modules 22, 24. Similarly, two battery submodules 72 are shown removed from corresponding bays 78, 79 in the edge modules 22, 24. The modularity of the rectifier submodules 70 and the battery submodules 72 allows individual submodules to be easily removed and repaired or replaced in the event that one of these submodules fails.

Figure 8A:
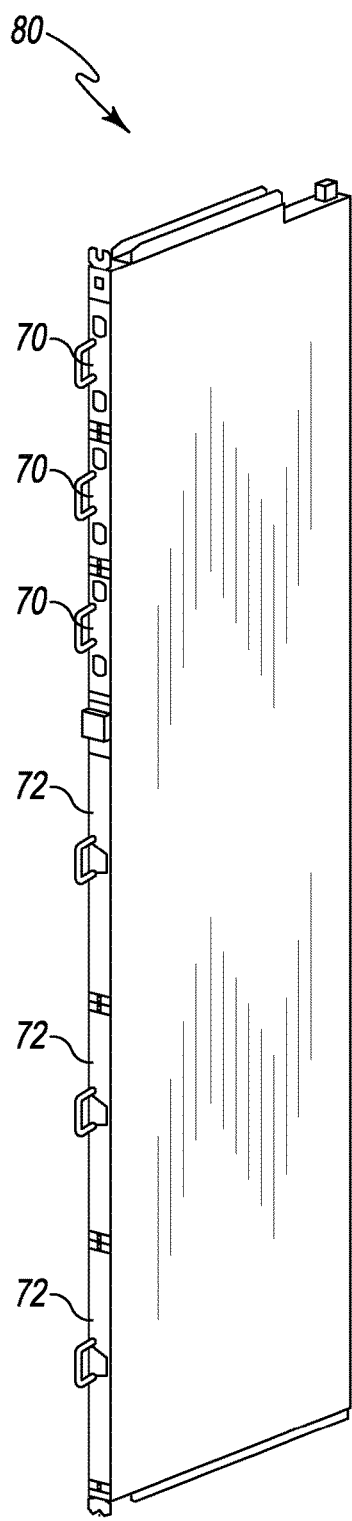
FIGS. 8A-C show different illustrative embodiments of edge modules, each having different numbers of rectifier submodules and battery submodules, that may be used in the cabinet of FIG. 1.
Figure 8B:
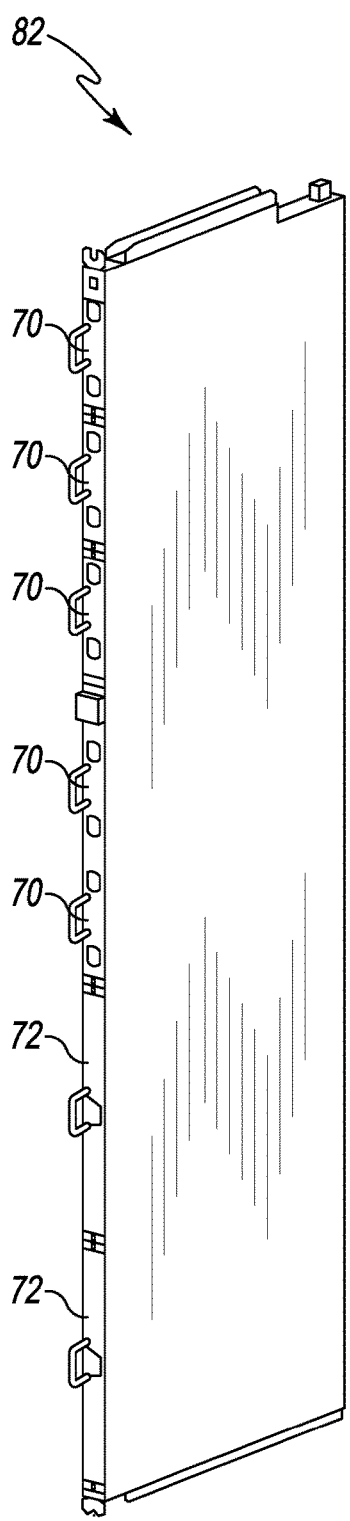
Figure 8C:
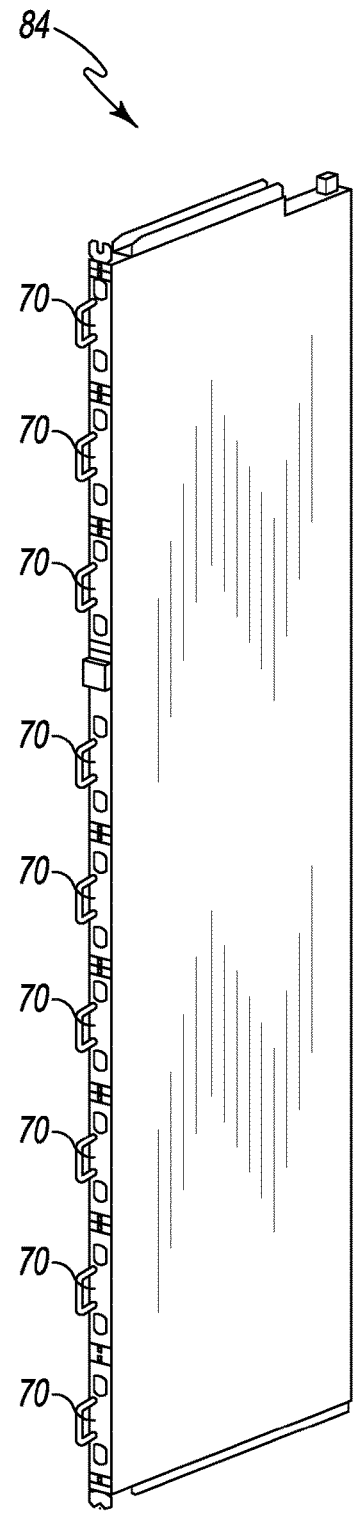

As illustrated in FIGS. 8A-C, it is contemplated that different edge modules 80, 82, 84, similar to the edge modules 22, 24, are capable of holding different numbers of rectifier submodules 70 and battery submodules 72. For instance, the edge module 80 of FIG. 8A is configured with three rectifier submodules 70 and three battery submodules 72. The edge module 82 of FIG. 8B is configured with five rectifier submodules 70 and two battery submodules 72. The edge module 84 of FIG. 8C is configured with nine rectifier submodules 70 (and no battery modules). It will be appreciated that the embodiments of FIGS. 8A-C are merely illustrative. By way of example, in another embodiment, an edge module might be configured with four battery modules (and no rectifier modules).

Figure 9:
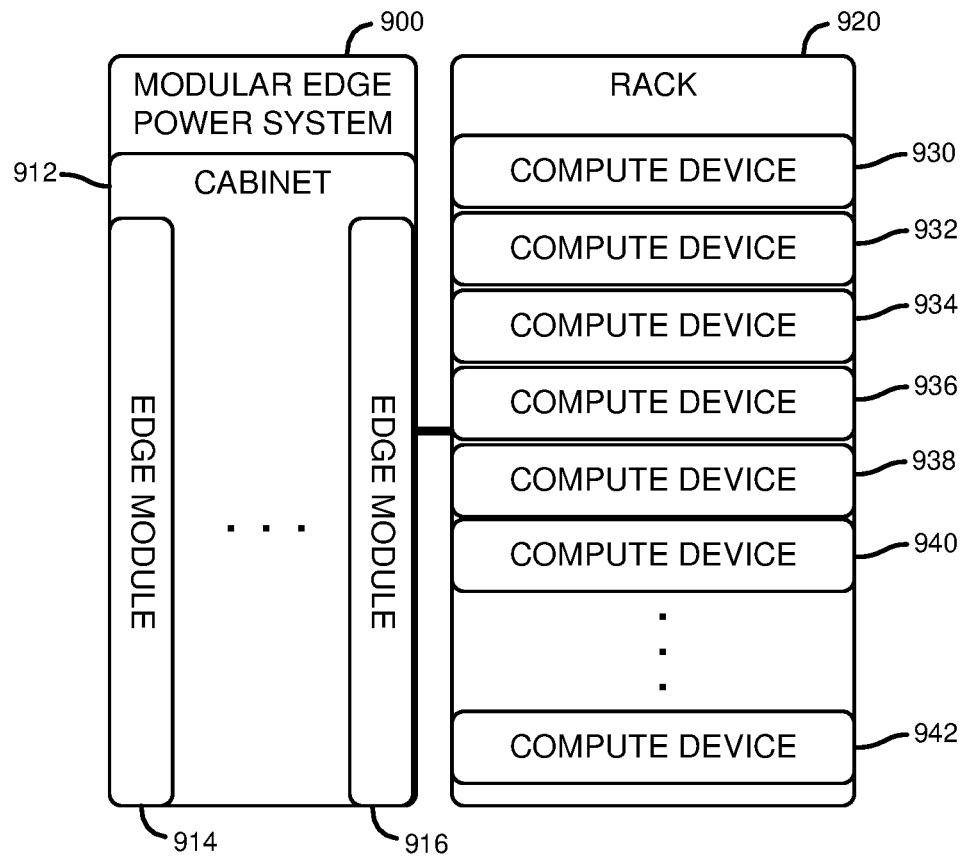
FIG. 9 is a simplified block diagram of at least one embodiment of a modular edge power system that connects to a side of a rack.

Referring now to FIG. 9, a modular edge power system 900, similar to the modular edge power system 10 of FIG. 1 may be configured to connect (e.g., electrically and, in some embodiments, mechanically) to a rack 920 of compute devices 930, 932, 934, 936, 938, 940, 942. That is, the cabinet 912 houses a set of edge modules 914, 916, similar to the edge modules 22, 24, that connect through one or more electrical conductors to the rack 920 of compute devices (e.g., to provide power thereto), rather than being housed in the same enclosure as the compute devices. As such, in this "side car" configuration, the modular edge power system 900 may provide the benefits of the modularity of the edge modules 914, 916 (e.g., enabling lower cost and faster maintenance than known systems) even for a rack of compute devices (e.g., an existing rack in a data center, a rack that was produced by a different manufacturer than the manufacturer of the modular edge power system 900, etc.) that is not configured to house the edge modules 914, 916.

Figure 10:
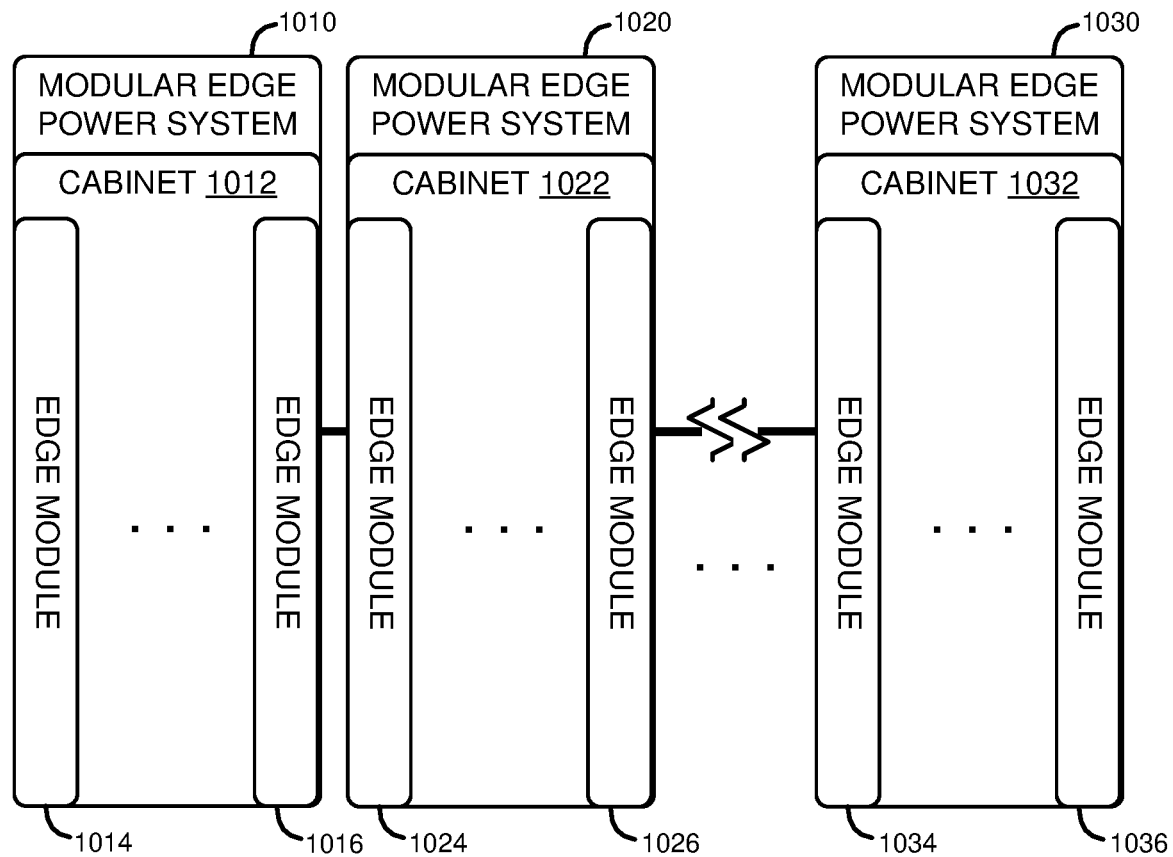
FIG. 10 is a simplified block diagram of at least one embodiment of multiple modular edge power systems that are linked together.

Referring now to FIG. 10, in some embodiments, modular edge power systems 1010, 1020, 1030, similar to the modular edge power system 10, may link together (e.g., electrically, and in some embodiments, mechanically) to utilize more edge modules 1014, 1016, 1024, 1026, 1034, 1036 (e.g., each similar to the edge modules 22, 24) than would fit within a single cabinet (e.g., the cabinet 12). Further, in the illustrative embodiment, each cabinet 1012, 1022, 1032 includes more edge modules (e.g., 3 or 4 edge modules) than the cabinet 12, as the cabinets 1012, 1022, 1024 do not also house a rack of compute devices.

Figure 11:
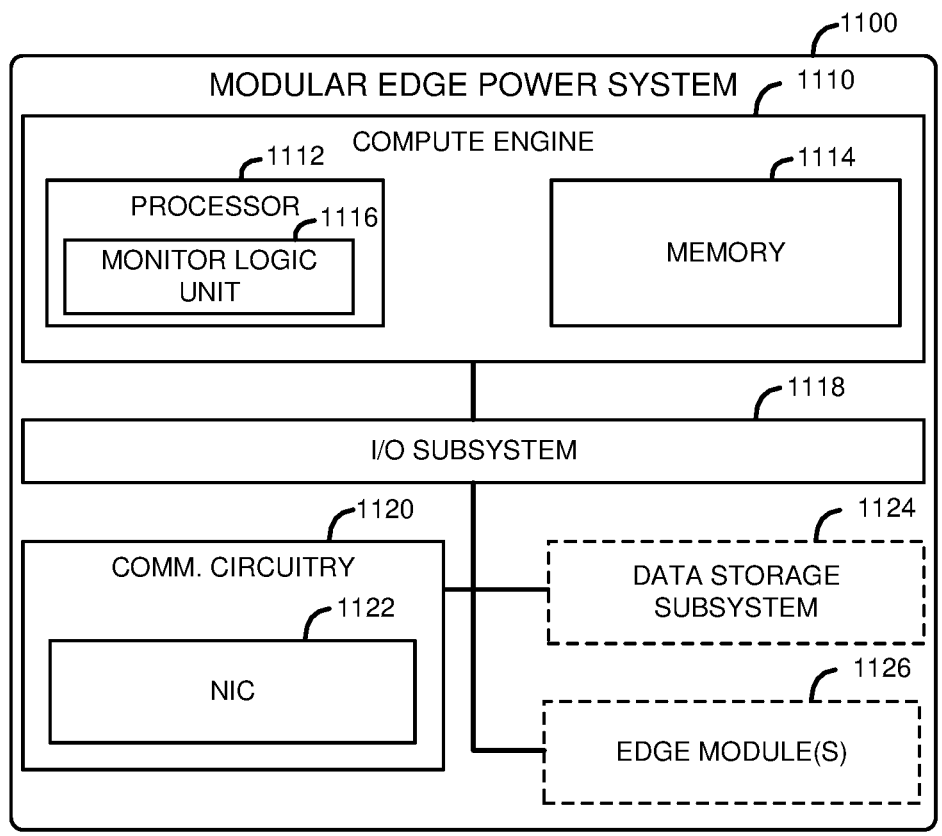
FIG. 11 is a simplified block diagram of components of at least one embodiment of a modular edge power system.

Referring now to FIG. 11, the modular edge power system 1100, similar to the modular edge power systems 10, 900, 1010, 1020, and 1030, in addition to having the physical, electrical, and mechanical features described above, may additionally include components to enable the modular edge power system 1100 to manage the operation of edge modules (e.g., edge modules 1126, which are similar to the edge modules 22, 24, 914, 916, 1014, 1016, 1024, 1026, 1034, 1036) and report status data to one or more other devices (e.g., device(s) in a building management system). As shown in FIG. 11, the illustrative modular edge power system 1100 includes a compute engine 1110, an input/output (I/O) subsystem 1118, communication circuitry 1120, a data storage subsystem 1124, and the edge modules 1126. Of course, in other embodiments, the modular edge power system 1100 may include other or additional components, such as those commonly found in a computer (e.g., a display, etc.). Additionally, in some embodiments, one or more of the illustrative components may be incorporated in, or otherwise form a portion of, another component.

The compute engine 1110 may be embodied as any type of device or collection of devices capable of performing various compute functions described below. In some embodiments, the compute engine 1110 may be embodied as a single device such as an integrated circuit, an embedded system, a field-programmable gate array (FPGA), a system-on-a-chip (SOC), or other integrated system or device. Additionally, in some embodiments, the compute engine 1110 includes or is embodied as a processor 1112 and a memory 1114. The processor 1112 may be embodied as any type of processor capable of performing the functions described herein. For example, the processor 1112 may be embodied as a microcontroller, a single or multi-core processor(s), or other processor or processing/controlling circuit. In some embodiments, the processor 1112 may be embodied as, include, or be coupled to an FPGA, an application specific integrated circuit (ASIC), reconfigurable hardware or hardware circuitry, or other specialized hardware to facilitate performance of the functions described herein. In the illustrative embodiment, the processor 1112 includes a monitor logic unit 1116 which may be embodied as any device or circuitry (e.g., reconfigurable circuitry, a field programmable gate array (FPGA), an application specific integrated circuit (ASIC), etc.) capable of offloading, from other functions of the processor 1112, functions related to determining the operational status of the edge modules (e.g., the edge modules 22, 24), determining, as a function of the operational status, whether maintenance should be performed on any of the edge modules (e.g., to replace one or more submodules, etc.), and, if so, providing report data to another device (e.g., in a building management system) indicating that maintenance should be performed on the edge module(s). Though shown as being integrated into the processor 1112, in some embodiments the monitor logic unit 1116 may be located in a different portion of the modular edge power system 1100 (e.g., as a discrete unit).

The main memory 1114 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. In some embodiments, all or a portion of the main memory 1114 may be integrated into the processor 1112. In operation, the main memory 1114 may store various software and data used during operation, such as data indicative of the status of edge modules installed in the modular edge power system 1100, applications, programs, libraries, and drivers.

The compute engine 1110 is communicatively coupled to other components of the modular edge power system 1100 via the I/O subsystem 1118, which may be embodied as circuitry and/or components to facilitate input/output operations with the compute engine 1110 (e.g., with the processor 1112, the main memory 1114, the monitor logic unit 1116, etc.) and other components of the modular edge power system 1100 (e.g., any installed edge modules 1126). For example, the I/O subsystem 1118 may be embodied as, or otherwise include, memory controller hubs, input/output control hubs, integrated sensor hubs, firmware devices, communication links (e.g., point-to-point links, bus links (e.g., Open Compute Project buses), wires, cables, light guides, printed circuit board traces, etc.), and/or other components and subsystems to facilitate the input/output operations. In some embodiments, the I/O subsystem 1118 may form a portion of a system-on-a-chip (SoC) and be incorporated, along with one or more of the processor 1112, the main memory 1114, and other components of the modular edge power system 1100, into the compute engine 1110.

The communication circuitry 1120 may be embodied as any communication circuit, device, or collection thereof, capable of enabling communications over a network between the modular edge power system 1100 and another device (e.g., a management compute device in a building management system, one or more compute devices in a rack, etc). The communication circuitry 1120 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 1120 includes a network interface controller (NIC) 1122. The NIC 1122 may be embodied as one or more add-in-boards, daughter cards, network interface cards, controller chips, chipsets, or other devices that may be used by the modular edge power system 1100 to connect with another device. In some embodiments, the NIC 1122 may be embodied as part of a system-on-a-chip (SoC) that includes one or more processors, or included on a multichip package that also contains one or more processors. In some embodiments, the NIC 1122 may include a local processor (not shown) and/or a local memory (not shown) that are both local to the NIC 1122. In such embodiments, the local processor of the NIC 1122 may be capable of performing one or more of the functions of the processor 1112. Additionally or alternatively, in such embodiments, the local memory of the NIC 1122 may be integrated into one or more components of the modular edge power system 1100 at the board level, socket level, chip level, and/or other levels.

The data storage subsystem 1124 may be embodied as any type of devices configured for short-term or long-term storage of data such as, for example, memory devices and circuits, memory cards, hard disk drives, solid-state drives, or other data storage devices. In the illustrative embodiment, the data storage subsystem includes data collected from the edge modules 1126 (e.g., operational status data) and reference data indicative of conditions under which maintenance should be performed on one or more of the edge modules 1126.

Figure 12:
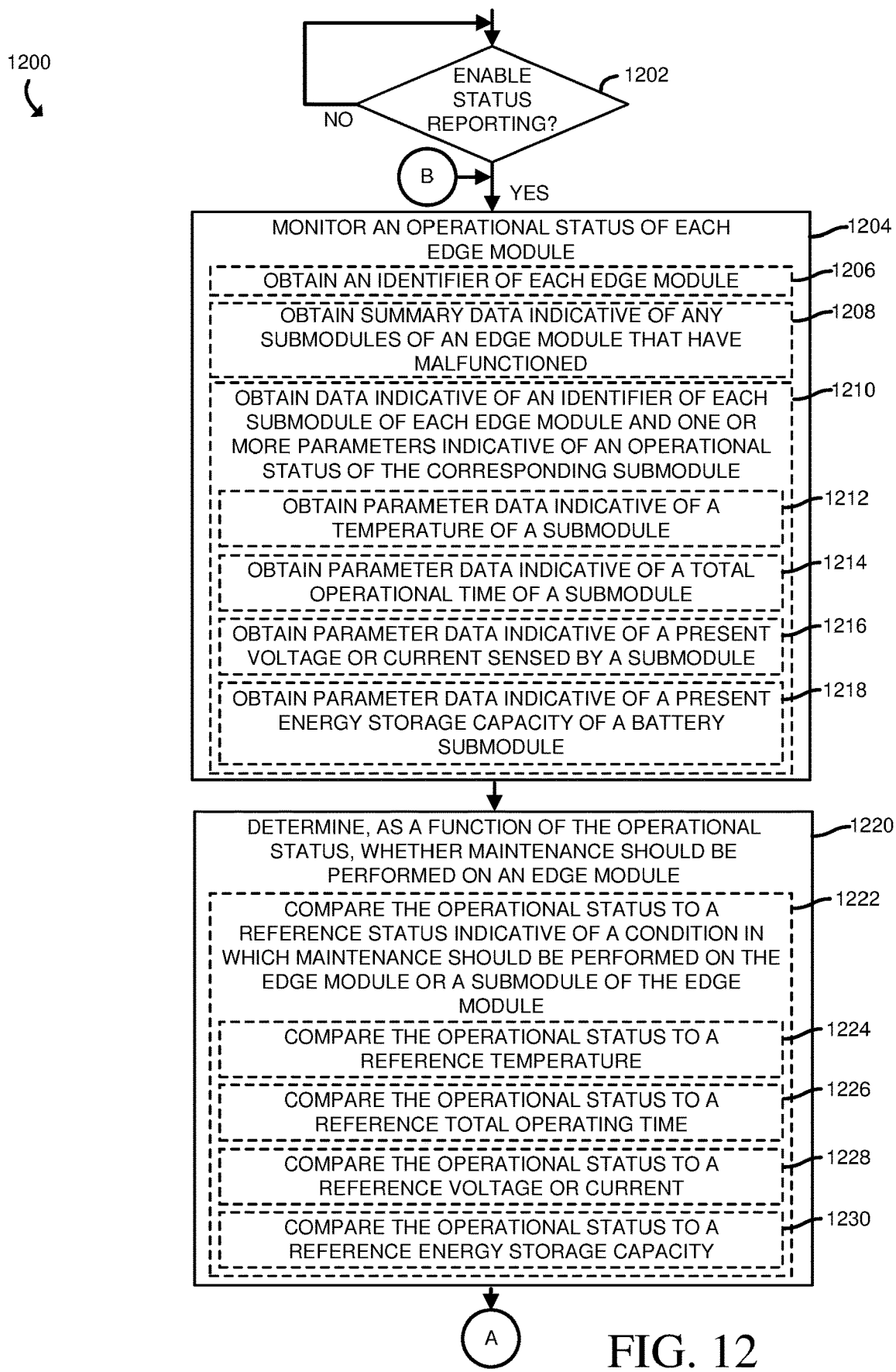
FIGS. 12-13 are simplified block diagrams of at least one embodiment of a method for performing status reporting that may be performed by a modular edge power system.

Referring now to FIG. 12, a modular edge power system disclosed herein (e.g., the modular edge power system 10) may perform a method 1200 of reporting the status of the edge modules (e.g., the edge modules 22, 24) to another device (e.g., to notify a device that maintenance should be performed on one or more of the edge modules 22, 24). The method 1200 begins with block 1202, in which the modular edge power system 10 determines whether to enable status reporting. In doing so, the modular edge power system 10 may make the determination based on whether the modular edge power system 10 is equipped with a monitor logic unit (e.g., the monitor logic unit 1116), based on a configuration setting (e.g., stored in the memory 1114 or in the data storage subsystem 1124) to enable status reporting, and/or based on other factors. Regardless, in response to a determination to enable status reporting, the method 1200 advances to block 1204, in which the modular edge power system 10 monitors an operational status of each edge module (e.g., the edge modules 22, 24). In doing so, and as indicated in block 1206, the modular edge power system 10 may obtain an identifier of each edge module 22, 24 (e.g., in a header or other portion of operational status data sent from each edge module in the modular edge power system 10). As indicated in block 1208, the modular edge power system 10 may obtain summary data (e.g., from each edge module 22, 24) which may be embodied any data indicative of any submodules (e.g., rectifier submodules, battery submodules, etc.) that have malfunctioned (e.g., identifier(s) of the submodule(s) and/or the bay(s) containing the submodule(s)). In other words, the summary data may exclude operational status data for any edge modules and submodules of those edge modules that have not experienced a malfunction or other anomaly.

As indicated in block 1210, in some embodiments, the modular edge power system 10 may obtain data indicative of an identifier of each submodule (e.g., installed in one of the edge modules) and one or more parameters indicative of the operational status of the corresponding submodule. For example, and as indicated in block 1212, the modular edge power system 10 may obtain parameter data indicative of a temperature of a submodule (e.g., of a rectifier submodule, a battery submodule, etc.). In some embodiments, the modular edge power system 10 may obtain parameter data indicative of a total operational time of a submodule (e.g., a number of days that the submodule has been in use), as indicated in block 1214. Additionally or alternatively, the modular edge power system 10 may obtain parameter data indicative of a voltage or current sensed by a submodule (e.g., indicative of an overvoltage, a short circuit, etc.), as indicated in block 1216. In some embodiments, the modular edge power system 10 may obtain parameter data indicative a present energy storage capacity of a battery submodule (e.g., data indicative of a present number of joules that the battery submodule is capable of storing, data indicative of a percentage reduction in the total energy storage capacity from the original energy storage capacity of a battery submodule, AH (Amp Hours), WH (Watt Hours), State of Charge, Reserve Time, etc.), as indicated in block 1218.

Subsequently, and as indicated in block 1220, the modular edge power system 10 determines, as a function of the operational status (e.g., from block 1204), whether maintenance should be performed on one or more of the edge modules (e.g., one or more of the edge modules 22, 24). In doing so, and as indicated in block 1222, the modular edge power system 10 may compare the operational status to a reference status indicative of a condition in which maintenance should be performed on an edge module or submodule of an edge module. For example, and as indicated in block 1224, the modular edge power system 10 may compare the operational status to a reference temperature (e.g., a temperature that if satisfied, is indicative of a malfunction of the edge module or submodule of an edge module). In some embodiments, and as indicated in block 1226, the modular edge power system 10 may compare the operational status to a reference total operating time (e.g., a number of days of operation, etc.). Additionally or alternatively, the modular edge power system 10 may compare the operational status to a reference voltage or current, as indicated in block 1228.

In some embodiments, the modular edge power system 10 may compare the operational status to a reference energy storage capacity (e.g., for a battery submodule), as indicated in block 1230. The reference status may be different for each component. For example, the reference total operating time for an edge module may be greater than the reference operating time for a battery submodule or a rectifier submodule (e.g., the edge module may be designed to operate over a longer period of time than the submodules contained within it). Similarly, the reference temperatures, voltages, and currents may be different for each component. In some embodiments, the reference status data may be provided in a configuration file (e.g., in a data storage device 1124). In other embodiments, each edge module and/or submodule may have the corresponding reference status data encoded (e.g., in a read only memory) in the module or submodule, and provide (e.g., through the I/O subsystem 1118) the reference status data to the modular edge power system 10 (e.g., to the monitor logic unit 1116) upon installation of the edge module or submodule into the modular edge power system 1100 and/or upon request from the modular edge power system 10. Subsequently, the method 1200 advances to block 1232 in which the modular edge power system 10 determines the subsequent course of action based on whether maintenance should be performed (e.g., as determined in block 1220).

Figure 13:
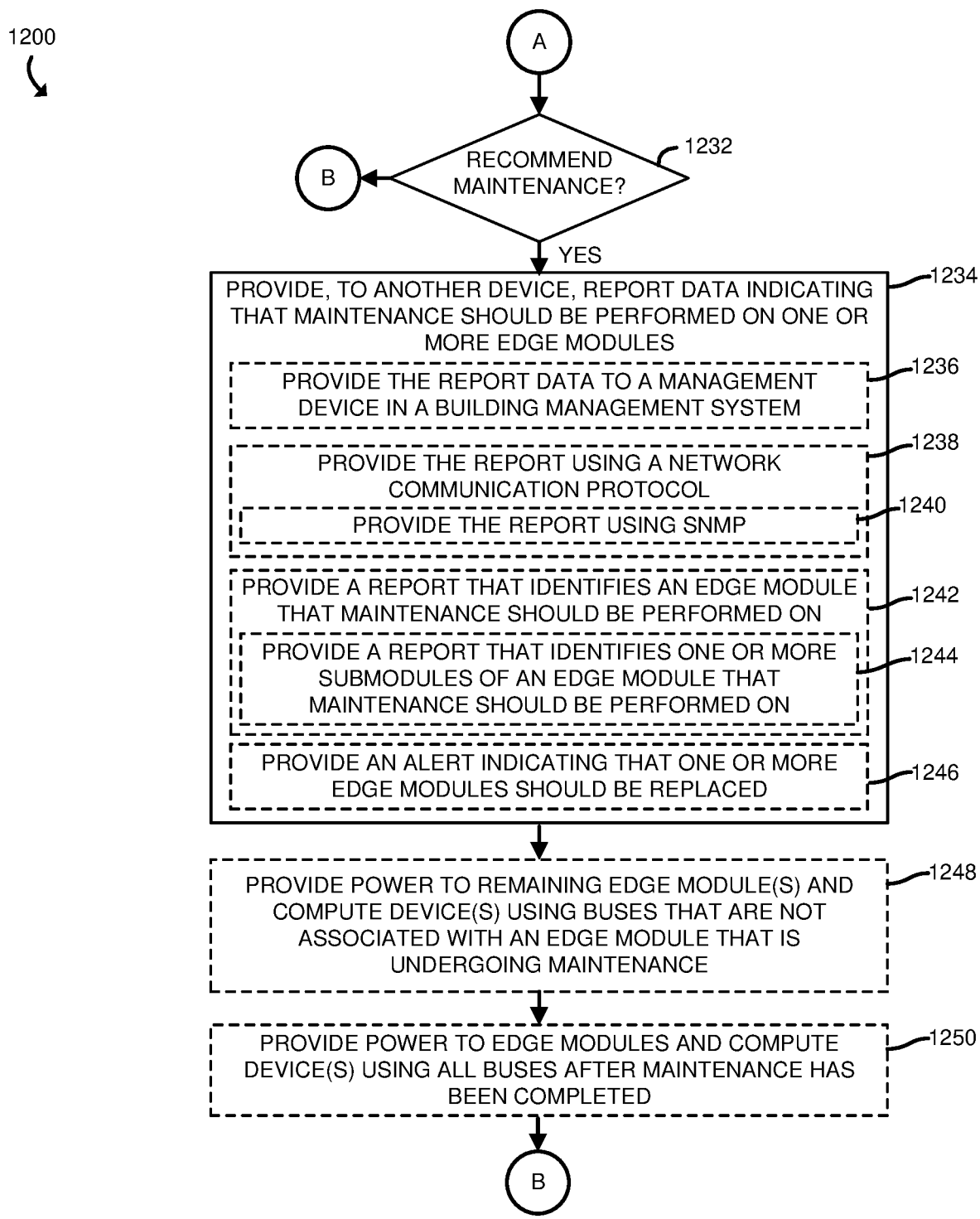

Referring now to FIG. 13, in response to a determination that maintenance is not recommended, the method 1200 loops back to block 1204 of FIG. 12 in which the modular edge power system 10 obtains an updated operational status of each edge module. Otherwise (e.g., if maintenance should be performed), the method 1200 advances to block 1234, in which the modular edge power system 10 provides, to another device, report data which may be embodied as any data indicating that maintenance should be performed on one or more of the edge modules. In doing so, and as indicated in block 1236, the modular edge power system 10 may provide the report data to a management device (e.g., a compute device that performs management operations) in a building management system (e.g., a management system for a data center). As indicated in block 1238, the modular edge power system 10 may provide the report (e.g., the report data) using a network communication protocol. For example, and as indicated in block 1240, the modular edge power system 10 may provide the report using a simple network management protocol (SNMP). Additionally or alternatively, the modular edge power system 10 may provide the report using another protocol, such as hypertext transfer protocol (HTTP) or hypertext transfer protocol secure (HTTPS) to enable a user to obtain and view the information in a defined visual format (e.g., using a web browser). As indicated in block 1242, the modular edge power system 10 may provide a report (e.g., report data) that identifies an edge module that maintenance should be performed on. Further, and as indicated in block 1244, the modular edge power system 10 may provide a report that identifies one or more submodules of an edge module that maintenance should be performed on (e.g., a specific battery submodule or rectifier submodule). As indicated in block 1246, the modular edge power system 10 may provide (e.g., in the report data) an alert indicating that an edge module should be replaced.

As indicated in block 1248, the modular edge power system 10 may provide power to remaining edge modules and compute devices using buses (e.g., bus assemblies 60, 62) that are not associated with an edge module that is presently undergoing maintenance (e.g., is removed from the modular edge power system 10). Subsequently, and as indicated in block 1250, the modular edge power system 10 may provide power to all of the edge modules and compute devices using all of the buses (e.g., bus assemblies 60, 62) after maintenance has been completed (e.g., after an edge module has been replaced or reinserted into the modular edge power system 10). Subsequently, the method 1200 loops back to block 1204 to obtain updated operational status data from the edge modules.

Although the method 1200 is described above as being performed by the modular edge power system 10, it should be understood that the method 1200 may also be performed by the modular edge power systems 900, 1010, 1020. 1030, 1100 or other embodiments thereof. Further, while the operations of the method 1200 are described as being performed in a particular order, it should be understood that in other embodiments, one or more of the operations may be performed in a different order and/or concurrently.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. There exist a plurality of advantages of the present disclosure arising from the various features of the apparatus, systems, and methods described herein. It will be noted that alternative embodiments of the apparatus, systems, and methods of the present disclosure may not include all of the features described, yet still benefit from at least some of the advantages of such features. Those of ordinary skill in the art may readily devise their own implementations of the apparatus, systems, and methods that incorporate one or more of the features of the present disclosure.

The invention claimed is:

1. A modular edge power system comprising:
   a housing having (i) a top and a bottom separated by a height of the housing, (ii) a first side and a second side separated by a width of the housing, and (iii) a front and a back separated by a depth of the housing;
   a plurality of bus assemblies; and
   a plurality of edge modules, each having (i) a length that extends substantially between the top and the bottom of the housing at one of the first side and the second side of the housing, and (ii) a width that extends at least partially between the front and the back of the housing, wherein each edge module further comprises:
      a plurality of power equipment submodules, wherein the plurality of power equipment submodules comprise:
         at least one rectifier submodule that includes circuitry configured to convert an alternating current into a direct current; and
         at least one battery submodule that includes circuitry configured to store energy; and
      a plurality of bays, wherein each bay is sized to receive one of the plurality of power equipment submodules therein,
   wherein each edge module is configured to supply power to a corresponding bus assembly of the plurality of bus assemblies,
   wherein each edge module is adapted to be removably inserted into the housing,
   wherein each edge module provides, through the corresponding bus assembly, power to one or more compute devices in a rack positioned outside the housing, and
   wherein each edge module is adapted to provide sufficient power to enable operation of every compute device in the rack such that when one edge module is removed, the remaining edge modules continue to supply the sufficient power to the compute devices in the rack, thereby providing redundancy in the edge modules to the modular edge power system.

2. The modular edge power system of claim 1, further comprising the rack.

3. The modular edge power system of claim 2, wherein the housing is configured to connect to a side of the rack.

4. The modular edge power system of claim 1, further comprising circuitry to identify the edge modules and monitor an operational status of each edge module.

5. The modular edge power system of claim 4, wherein the circuitry is further to provide, through a communication protocol, the operational status to a building management system.

6. The modular edge power system of claim 5, wherein the circuitry is to provide the operational status through a simple network management protocol (SNMP).

7. The modular edge power system of claim 5, wherein the circuitry is further to:
   determine, as a function of the monitored operational status, whether one of the edge modules should be replaced; and
   provide, in response to a determination that one of the edge modules should be replaced, an alert to the building management system that the edge module should be replaced.

8. The modular edge power system of claim 1, further comprising circuitry to connect the housing to a second housing of a second modular edge power system having one or more additional edge modules.

9. The modular edge power system of claim 1, wherein each bus is an Open Compute Project (OCP) bus.

10. The modular edge power system of claim 9, wherein each edge module includes a connector configured to interface with and electrically couple to a corresponding one of the OCP buses.

11. The modular edge power system of claim 1, wherein each bus is a 48 volt bus.

12. The modular edge power system of claim 1, wherein the housing further comprises first guide rails proximate to the top and the bottom of the housing that are configured to guide each edge module into the housing.

13. The modular edge power system of claim 12, wherein the first guide rails are configured to interface with second guide rails of each edge module.

14. A modular edge power system comprising:
   a housing having (i) a top and a bottom separated by a height of the housing, and (ii) a front and a back separated by a depth of the housing, the housing further comprising:
      first guide rails positioned proximate to the top and the bottom of the housing, the first guide rails extending at least partially from the front to the back of the housing; and
      a fixed edge assembly positioned proximate to the back of the housing, the fixed edge assembly further comprising a plurality of fixed bus assemblies; and
   a plurality of edge modules, each edge module having (i) a top and a bottom separated by a length of the edge module, and (ii) a front and a back separated by a width of the edge module, wherein each edge module further comprises:

second guide rails positioned on the top and the bottom of the edge module, the second guide rails extending from the front to the back of the edge module;

a plurality of connectors positioned on the back of the edge module that faces the fixed edge assembly;

a plurality of power equipment submodules; and a plurality of bays sized to receive one of the plurality of power equipment submodule therein, wherein each edge module is adapted to be removably inserted into the housing by interfacing the second guide rails of the edge module with the first guide rails of the housing, wherein when each edge module is removably inserted into the housing, each edge module interfaces with the fixed edge assembly via the plurality of connectors being electrically coupled with a corresponding fixed bus assembly, wherein when each edge module is removably inserted into the housing, the length of each edge module extends substantially between the top and the bottom of the housing, wherein each edge module provides, through the corresponding fixed bus assembly, power to one or more compute devices in a rack, wherein each bus is adapted to provide sufficient power to enable operation of every compute device in the rack.

15. The modular edge power system of claim 14, further comprising the rack.

16. The modular edge power system of claim 15, wherein the housing is configured to connect to a side of the rack.

17. The modular edge power system of claim 14, further comprising circuitry to identify the edge modules and monitor an operational status of each edge module.

18. The modular edge power system of claim 17, wherein the circuitry is further to provide, through a communication protocol, the operational status to a building management system.

19. The modular edge power system of claim 18, wherein the circuitry is to provide the operational status through a simple network management protocol (SNMP).

20. The modular edge power system of claim 18, wherein the circuitry is further to:
    determine, as a function of the monitored operational status, whether one of the edge modules should be replaced; and
    provide, in response to a determination that one of the edge modules should be replaced, an alert to the building management system that the edge module should be replaced.

* * * * *